United States Patent
Liang et al.

(10) Patent No.: US 10,032,770 B2
(45) Date of Patent: *Jul. 24, 2018

(54) SEMICONDUCTOR DEVICE STRUCTURE AND METHOD

(71) Applicants: Taiwan Semiconductor Manufacturing Company, Ltd., Hsinchu (TW); National Taiwan University, Taipei (TW)

(72) Inventors: Chi-Te Liang, Taipei (TW); Minghwei Hong, Zhubei (TW); Fan-Hung Liu, New Taipei (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/483,433

(22) Filed: Apr. 10, 2017

(65) Prior Publication Data

US 2017/0213822 A1 Jul. 27, 2017

Related U.S. Application Data

(63) Continuation of application No. 14/713,978, filed on May 15, 2015, now Pat. No. 9,620,605.

(51) Int. Cl.
*H01L 27/06* (2006.01)
*H01L 21/02* (2006.01)
(Continued)

(52) U.S. Cl.
CPC ...... *H01L 27/0688* (2013.01); *H01L 21/0228* (2013.01); *H01L 21/0254* (2013.01); *H01L 21/0257* (2013.01); *H01L 21/0262* (2013.01); *H01L 21/02178* (2013.01); *H01L 21/02181* (2013.01); *H01L 21/02192* (2013.01); *H01L 21/02266* (2013.01); *H01L 21/02546* (2013.01); *H01L 21/02631* (2013.01); *H01L 21/2654* (2013.01); *H01L 21/28264* (2013.01); *H01L 21/308* (2013.01); *H01L 21/30612* (2013.01);
(Continued)

(58) Field of Classification Search
CPC ......... H01L 29/42364; H01L 29/66431; H01L 29/7786
USPC ........................................................ 257/194
See application file for complete search history.

(56) References Cited

U.S. PATENT DOCUMENTS

| 6,684,008 B2 | 1/2004 | Young et al. |
| 2007/0138565 A1 | 6/2007 | Datta et al. |

(Continued)

OTHER PUBLICATIONS

Hong, M., et al., "Epitaxial Cubic Gadolinium Oxide as a Dielectric for Gallium Arsenide Passivation," Science, Mar. 19, 1999, vol. 283, pp. 1897-1900.

*Primary Examiner* — Fernando L Toledo
*Assistant Examiner* — Adam S Bowen
(74) *Attorney, Agent, or Firm* — Slater Matsil, LLP

(57) ABSTRACT

A multi-layered semiconductor device and method of manufacture are provided. In an embodiment a first semiconductor layer, a first insulator layer, a second semiconductor layer, a second insulator layer, and a third semiconductor layer are formed over a substrate. A first transistor comprises the first semiconductor layer, the first insulator layer, and the second semiconductor layer, and a second transistor comprises the second semiconductor layer, the second insulator layer, and the third semiconductor layer.

20 Claims, 9 Drawing Sheets

(51) Int. Cl.
  *H01L 21/265*  (2006.01)
  *H01L 21/28*  (2006.01)
  *H01L 21/306*  (2006.01)
  *H01L 21/311*  (2006.01)
  *H01L 21/308*  (2006.01)
  *H01L 21/768*  (2006.01)
  *H01L 29/66*  (2006.01)
  *H01L 29/778*  (2006.01)
  *H01L 21/8252*  (2006.01)

(52) U.S. Cl.
  CPC ... *H01L 21/31111* (2013.01); *H01L 21/31144* (2013.01); *H01L 21/76805* (2013.01); *H01L 21/76843* (2013.01); *H01L 21/76895* (2013.01); *H01L 21/8252* (2013.01); *H01L 27/0605* (2013.01); *H01L 29/66462* (2013.01); *H01L 29/7786* (2013.01)

(56) References Cited

U.S. PATENT DOCUMENTS

| | | |
|---|---|---|
| 2008/0259687 A1 | 10/2008 | Specht et al. |
| 2012/0043587 A1 | 2/2012 | Takahashi |
| 2012/0326215 A1 | 12/2012 | Srivastava et al. |
| 2014/0008715 A1 | 1/2014 | Sakuma et al. |
| 2015/0372097 A1 | 12/2015 | Bao et al. |

SEMICONDUCTOR DEVICE STRUCTURE AND METHOD

PRIORITY CLAIM AND CROSS-REFERENCE

This application is a continuation of U.S. patent application Ser. No. 14/713,978, filed May 15, 2015, entitled "Semiconductor Device Structure and Method," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative techniques of manufacturing semiconductor dies.

However, as individual devices achieve smaller and smaller sizes, the ability to reduce the size even further comes up against larger and larger hurdles. As such, the ability to pack a larger and larger number of devices onto the same size footprint also comes up against larger and larger hurdles. As such, additional techniques and manufacturing processes need to be developed in order to continue the process of manufacturing more and more devices within a footprint of a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
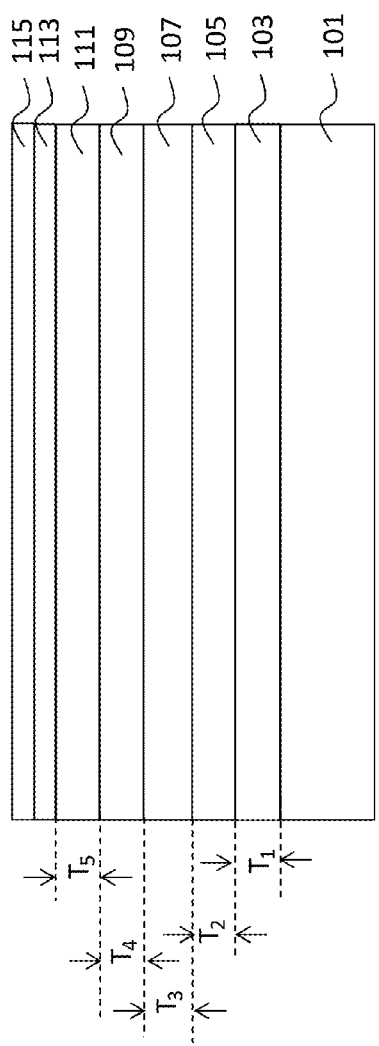
FIG. 1 illustrates a formation of a plurality of semiconductive and insulative layers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a substrate 101 with a first semiconductor layer 103, a first insulator layer 105, a second semiconductor layer 107, a second insulator layer 109, and a third semiconductor layer 111 formed over the substrate 101. In an embodiment the substrate 101 comprises an insulating or semi-insulating material such as an amorphous silicon oxide or aluminum oxide that has been grown on a support base (not separately illustrated in FIG. 2), such as a silicon base, for structural support. Alternatively, the substrate 101 may be a semiconductor on insulator with the insulating material being a single crystal material which may be separately grown and then bonded to the support base using, for example, a fusion bonding process. Any suitable material and suitable method of formation may alternatively be utilized.

The first semiconductor layer 103 may be a semiconductor material that will be utilized to form a third channel 211 (not illustrated in FIG. 1 but illustrated and described further below with respect to FIG. 2) and also be utilized as a base material to grow the first insulator layer 105. In an embodiment the semiconductor material may be gallium arsenide, although any other suitable semiconductor material, such as gallium nitride (which may have a high density of dislocations without affecting performance), aluminum gallium nitride, indium gallium nitride, aluminum gallium arsenide, or indium gallium arsenide, may alternatively be utilized.

The first semiconductor layer 103 may be grown over the substrate 101 using a deposition or growth process such as molecular beam epitaxy (MBE) or metal-organic chemical vapor deposition (MOCVD). In an embodiment in which the first semiconductor layer 103 is gallium arsenide, a molecular beam epitaxy process using precursors such as gallium and arsenic may be utilized in order epitaxially grow the first semiconductor layer 103 onto the substrate 101 to a first thickness $T_1$ of between about 10 nm and about 50 nm, such as about 20 nm. However, any other suitable method of formation, and any other suitable thickness may alternatively be utilized.

Additionally, the first semiconductor layer 103 may be doped as it is being grown over the substrate 101. In an embodiment the first semiconductor layer 103 may be doped with a dopant that is suitable for use with the type of device to be formed from the first semiconductor layer 103. For example, in an embodiment in which NMOS devices are desired to be formed from the first semiconductor layer 103, the first semiconductor layer 103 may be doped with P-type dopants such as boron or gallium. Alternatively, if PMOS devices are desired to be formed from the first semiconductor layer 103, N-type dopants such as phosphorous or arsenic may be used.

In an embodiment the dopants are introduced to the material of the first semiconductor layer 103 (e.g., gallium arsenide) as the first semiconductor layer 103 is grown. For example, during an epitaxial growth process, precursors that comprise the desired dopants are placed in situ into the reaction vessel along with the precursor reactants for the material of the first semiconductor layer 103. As such, the dopants are introduced to the material of the first semiconductor layer 103 and are incorporated into the material of the first semiconductor layer 103 to provide the first semiconductor layer 103 the desired conductivity.

Alternatively, the dopants may be introduced after the material of the first semiconductor layer 103 (e.g., the gallium arsenide) has been grown. In this embodiment the material of the first semiconductor layer 103 is grown without the dopants, and an introduction process such as an implantation process or diffusion process is utilized to introduce the dopants into the first semiconductor layer 103. Once the dopants have been introduced, an anneal may be performed to activate the dopants.

The first insulator layer 105 is formed over the first semiconductor layer 103 in order to isolate the first semiconductor layer 103 from direct electrical connection with overlying layers (e.g., the second semiconductor layer 107). Additionally, in an embodiment the first insulator layer 105 is formed to allow the second semiconductor layer 107 to be grown using the first insulator layer 105 as a nucleation layer. As such, the first insulator layer 105 may be a material such as a single crystal oxide such as gadolinium oxide ($Gd_2O_3$), aluminum oxide ($Al_2O_3$), or hafnium oxide ($HfO_2$). However, any suitable material may alternatively be utilized to form the single crystal oxide.

The first insulator layer 105 may be formed using an epitaxial process such as molecular beam epitaxy (MBE), although other suitable deposition processes that form a single crystal, such as atomic layer deposition (ALD), may alternatively be utilized. In an embodiment in which the first insulator layer 105 is gadolinium oxide and the first insulator layer 105 is formed using a molecular beam epitaxy process, precursors such as $Gd[OC(CH_3)_2CH(CH_3)_2]_3$ and $H_2O$ may be utilized to form the first insulator layer 105 to a second thickness $T_2$ that allows for a single crystal while also being suitable for use as a gate dielectric to the underlying first semiconductor layer 103. As such, while the precise thickness of the first insulator layer 105 is tuned based at least in part on a desired gate voltage (described further below with respect to FIG. 4), in an embodiment the second thickness $T_2$ may be between about 6 Å and about 20 nm, such as about 1 nm. However, any suitable method of manufacture and thickness may alternatively be utilized.

The second semiconductor layer 107 is formed over the first insulator layer 105 and comprises a semiconductor material that can be grown on the single crystal material of the first insulator layer 105. In an embodiment the second semiconductor layer 107 may be a semiconductor material similar to the first semiconductor layer 103, such as gallium arsenide, although any other suitable semiconductor material, such as gallium nitride, aluminum gallium nitride, indium gallium nitride, aluminum gallium arsenide, or indium gallium arsenide, may alternatively be utilized.

The second semiconductor layer 107 may be formed using a deposition or growth process such as molecular beam epitaxy (MBE) or metal-organic chemical vapor deposition (MOCVD). In an embodiment the second semiconductor layer 107 may be grown to a third thickness $T_3$ of between about 10 nm and about 40 nm, such as about 15 nm. However, any other suitable method of formation, and any other suitable thickness may alternatively be utilized.

Additionally, similar to the first semiconductor layer 103, the second semiconductor layer 107 may also be doped with suitable dopants. In an embodiment the second semiconductor layer 107 may be doped with dopants based on the type of device to form from the second semiconductor layer 107 (e.g., PMOS, NMOS, etc.). The dopants may be placed within the second semiconductor layer 107 either in situ as the second semiconductor layer 107 is grown or else after the second semiconductor layer 107 has been grown with an implantation or other suitable process.

The second insulator layer 109 is formed over the second semiconductor layer 107 in order to isolate the second semiconductor layer 107 from direct electrical connection with overlying layers (e.g., the third semiconductor layer 111). In an embodiment the second insulator layer 109 is formed to allow the third semiconductor layer 111 to be formed using the second insulator layer 109 as a nucleation layer. As such, the second insulator layer 109 may be a material such as a single crystal oxide such as gadolinium oxide ($Gd_2O_3$), $Al_2O_3$, or $HfO_2$. However, any suitable material may alternatively be utilized to form the single crystal oxide.

The second insulator layer 109 may be formed using an epitaxial process such as molecular beam epitaxy (MBE), although other suitable deposition processes that form a single crystal may alternatively be utilized, such as atomic layer deposition (ALD). In an embodiment in which the second insulator layer 109 is gadolinium oxide and the second insulator layer 109 is formed using a molecular beam epitaxy process, precursors such as $Gd[OC(CH_3)_2CH(CH_3)_2]_3$ and $H_2O$ may be utilized to form the second insulator layer 109 to a fourth thickness $T_4$ that allows for a single crystal while also being suitable for use as a gate dielectric to the underlying second semiconductor layer 107. As such, while the precise thickness of the second insulator layer 109 is tuned based at least in part a desired gate voltage (described further below with respect to FIG. 4), in an embodiment the fourth thickness $T_4$ may be between about 6 Å and about 20 nm, such as about 5 nm. However, any suitable method of manufacture and thickness may alternatively be utilized.

The third semiconductor layer 111 is formed over the second insulator layer 109 and comprises a semiconductor material that can be grown on the second insulator layer 109. In an embodiment the third semiconductor layer 111 may be a semiconductor material similar to the first semiconductor layer 103, such as gallium arsenide, although any other suitable semiconductor material, such as gallium nitride, aluminum gallium nitride, indium gallium nitride, aluminum gallium arsenide, or indium gallium arsenide, may alternatively be utilized.

The third semiconductor layer 111 may be formed using a using a deposition or growth process such as molecular beam epitaxy (MBE) or metal-organic chemical vapor deposition (MOCVD) that uses the second insulator layer 109 as a nucleation layer. In an embodiment in which gallium arsenide is utilized as the material for the third semiconductor layer 111, precursors such as gallium and arsenide may be utilized in the molecular beam epitaxy process to grow the third semiconductor layer 111 to a fifth thickness $T_5$ of between about 3 nm and about 50 nm, such as about 5 nm. However, any other suitable method of formation, and any other suitable thickness may alternatively be utilized.

FIG. 1 additionally illustrates an optional formation of a gate dielectric 113 and a gate electrode 115 in accordance with some embodiments. The gate dielectric 113 and the gate electrode 115 may be formed on the third semiconductor layer 111 by any suitable process known in the art. The gate dielectric 113 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. In an embodiment the gate dielectric 113 may have a relative permittivity value greater than about 4.

In an embodiment in which the gate dielectric 113 comprises an oxide layer, the gate dielectric 113 may be formed by chemical vapor deposition (CVD) techniques using tetra-ethyl-ortho-silicate (TEOS) and oxygen as a precursor. In one embodiment, the gate dielectric 113 may be between about 8 Å to about 50 Å in thickness, such as about 16 Å in thickness.

The gate electrode 115 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 115 is poly-silicon, the gate electrode 115 may be formed by depositing doped or undoped poly-silicon by low-pressure chemical vapor deposition (LPCVD) to a thickness in the range of about 100 Å to about 2,500 Å, such as about 1,500 Å.

Figure 2:
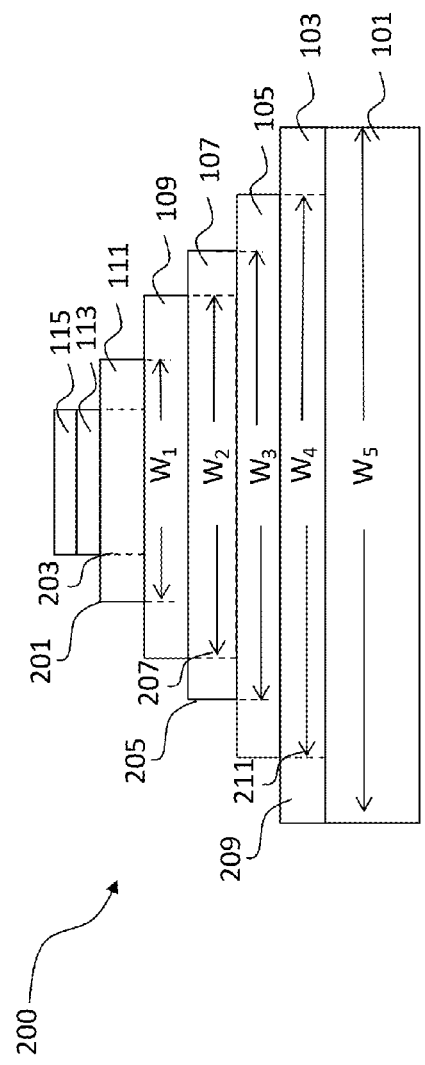
FIG. 2 illustrates a patterning of the plurality of semiconductive and insulative layers in accordance with some embodiments.

FIG. 2 illustrates a patterning of the gate electrode 115, the gate dielectric 113, the first semiconductor layer 103, the first insulator layer 105, the second semiconductor layer 107, the second insulator layer 109, and the third semiconductor layer 111. In an embodiment a first photoresist (not separately illustrated) is placed over the gate electrode 115 and then exposed to a patterned energy source and developed in order to form the first photoresist into a mask. Once masked, the gate electrode 115 may be etched using, for example, a reactive ion etch, in order to transfer the pattern of the first photoresist into the gate electrode 115 and the gate dielectric 113 using one or more etch processes. Once the pattern has been transferred, the first photoresist may be removed using a process such as ashing, whereby the temperature of the first photoresist is increased until the first photoresist undergoes a thermal decomposition and may be easily removed.

After the first photoresist has been removed, a second photoresist (also not illustrated in FIG. 2), may be placed over the now patterned gate electrode 115 and gate dielectric 113 and over now exposed portions of the third semiconductor layer 111. A similar process of exposure, development, etching, and removal of the second photoresist may be repeated in order to pattern the third semiconductor layer 111. In an embodiment the third semiconductor layer 111 may be patterned to have a first width $W_1$ of between about 2 μm and about 20 μm, such as about 5 μm.

Additionally, portions of the third semiconductor layer 111 that are not covered by the now patterned gate electrode 115 and gate dielectric 113 may be doped with dopants in order to form first source/drain regions 201 on opposing sides of a first channel 203 that extends beneath the patterned gate electrode 115 and gate dielectric 113. In an embodiment the third semiconductor layer 111 is doped with a dopant that is suitable for use with the type of device to be formed from the third semiconductor layer 111. For example, in an embodiment in which NMOS devices are desired to be formed from the third semiconductor layer 111, the uncovered portions of the third semiconductor layer 111 may be doped with N-type dopants such as phosphorous or arsenic. Alternatively, if PMOS devices are desired to be formed from the third semiconductor layer 111, P-type dopants such as boron or gallium may be used. In an embodiment the dopants may be introduced using an introduction process such as an implantation process or diffusion process. Once the dopants have been introduced, an anneal may be performed to activate the dopants.

However, while the introduction of the dopants and the formation of the first source/drain regions 201 are described above as being performed after the patterning of the third semiconductor layer 111, this is intended to merely be an illustrative embodiment and is not intended to limit the embodiments. Rather, any suitable process of formation may be performed at any suitable time, either before or after the patterning of the third semiconductor layer 111, may alternatively be utilized. All such combination of processes are fully intended to be included within the scope of the embodiments.

After the third semiconductor layer 111 has been patterned, the second insulator layer 109 may be patterned. In an embodiment a similar process as described above with respect to the patterning of the third semiconductor layer 111 may be performed, such as placement of a third photoresist (not illustrated in FIG. 2), exposure and development of the third photoresist, an etching of the second insulator layer 109, and a removal of the third photoresist. However, any suitable method of patterning the second insulator layer 109 may alternatively be performed. Additionally, because the second insulator layer 109 is an insulator layer, no dopants are intentionally placed within the second insulator layer 109. In an embodiment the second insulator layer 109 may be patterned to have a second width $W_2$ of between about 5 μm and about 100 μm, such as about 50 μm.

After the second insulator layer 109 has been patterned, the second semiconductor layer 107 may be patterned. In an embodiment a similar process as described above with respect to the patterning of the second semiconductor layer 107 may be performed, such as placement of a fourth photoresist (not illustrated in FIG. 2), exposure and development of the fourth photoresist, an etching of the second semiconductor layer 107, and a removal of the fourth photoresist. Additionally, suitable dopants may also be implanted within the patterned second semiconductor layer 107 to form second source/drain regions 205 on opposing sides of a second channel 207. Any suitable method of patterning the second semiconductor layer 107 may alternatively be performed. In an embodiment the second semiconductor layer 107 may be patterned to have a third width $W_3$ of between about 10 μm and about 200 μm, such as about 100 μm.

After the second semiconductor layer 107 has been patterned, the first insulator layer 105 may be patterned. In an embodiment a similar process as described above with respect to the patterning of the second insulator layer 109, such as placement of a fifth photoresist (not illustrated in FIG. 2), exposure and development of the fifth photoresist, an etching of the first insulator layer 105, and a removal of the fifth photoresist. However, because the first insulator layer 105 is an insulator layer, no dopants are intentionally placed within the first insulator layer 105. Any suitable method of patterning the first insulator layer 105 may alternatively be performed. In an embodiment the first insulator layer 105 may be patterned to have a fourth width $W_4$ of between about 20 μm and about 400 μm, such as about 150 μm.

After the first insulator layer 105 has been patterned, the first semiconductor layer 103 may be patterned. In an embodiment a similar process as described above with respect to the patterning of the second semiconductor layer 107 may be performed, such as placement of a sixth photoresist (not illustrated in FIG. 2), exposure and development of the sixth photoresist, an etching of the first semiconductor layer 103, and a removal of the sixth photoresist. Additionally, suitable dopants may also be implanted within the patterned first semiconductor layer 103 to form third source/drain regions 209 on opposing sides of a third channel 211. However, any suitable method of patterning the first semiconductor layer 103 may alternatively be performed. In an embodiment the first semiconductor layer 103 may be patterned to have a fifth width $W_5$ of between about 20 μm and about 400 μm, such as about 150 μm.

Figure 3:
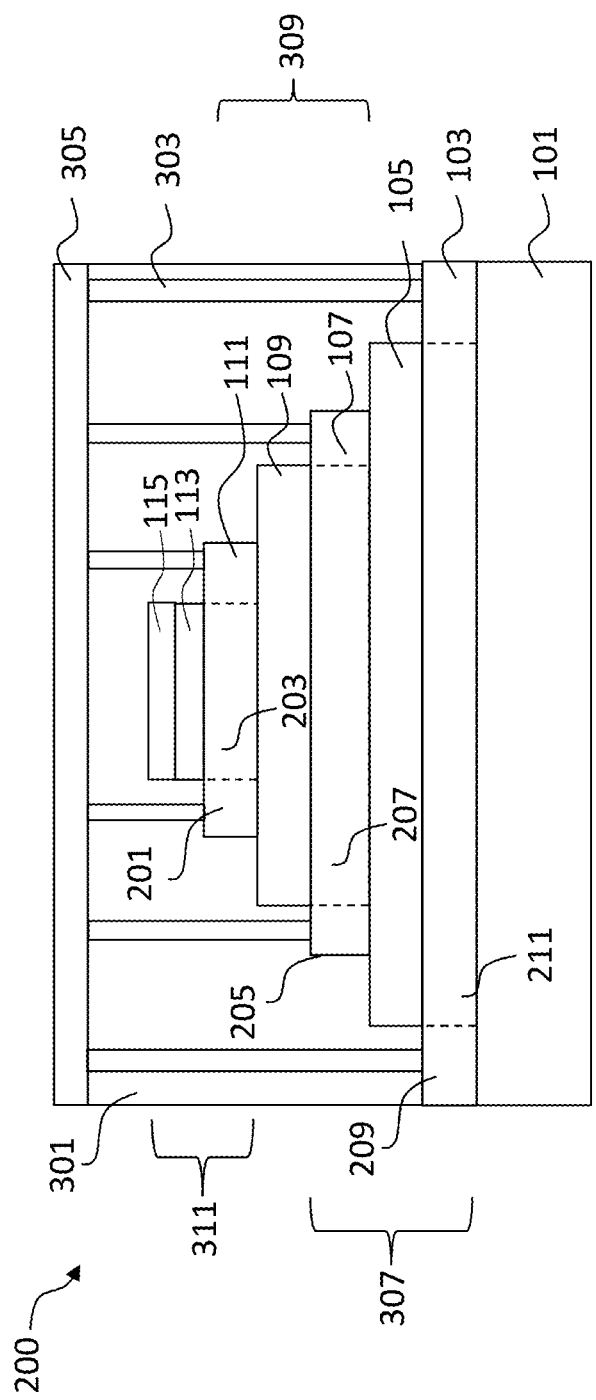
FIG. 3 illustrates a formation of contacts to the plurality of semiconductive layers in accordance with some embodiments.

FIG. 3 illustrates a formation of an interlayer dielectric layer 301 over the first semiconductor layer 103, the first insulator layer 105, the second semiconductor layer 107, the second insulator layer 109, and the third semiconductor layer 111. In an embodiment the interlayer dielectric layer 301 is a dielectric material such as silicon oxide or, alternatively, a high-k dielectric material that works to electrically isolate the surfaces of the first semiconductor layer 103, the second semiconductor layer 107, and the third semiconductor layer 111 from overlying conductive structures. The interlayer dielectric layer 301 may be formed using a deposition process such as chemical vapor deposition, physical vapor deposition, atomic layer deposition, or the like, although any suitable process may alternatively be utilized.

FIG. 3 also illustrates a formation of contacts 303 to the first semiconductor layer 103, the second semiconductor layer 107, and the third semiconductor layer 111. In an embodiment the contacts 303 may comprise shallow ohmic contacts that help to avoid current leakage between the various semiconductor layers and reduce echo. The contacts 303 may be formed through the interlayer dielectric layer 301 with suitable photolithography and etching techniques. In an embodiment a photoresist material is utilized to create a patterned mask to define the contacts 303. Additional masks, such as a hardmask, may also be used. An etching process, such as an anisotropic or isotropic etch process, is performed to etch the interlayer dielectric layer 301.

The contacts 303 may then be formed so as to contact the first semiconductor layer 103, the second semiconductor layer 107, the third semiconductor layer 111, and if present, the gate electrode 115. The contacts 303 may comprise a barrier/adhesion layer (not individually shown in FIG. 2) to prevent diffusion and provide better adhesion for the contacts 303. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 303 may be formed of any suitable conductive material, such as a highly-conductive, low-resistive metal, elemental metal, transition metal, or the like. In an exemplary embodiment the contacts 303 are formed of tungsten, although other materials, such as copper, could alternatively be utilized. In an embodiment in which the contacts 303 are formed of tungsten, the contacts 303 may be deposited by CVD techniques known in the art, although any method of formation could alternatively be used.

Metallization layers 305 are formed over the interlayer dielectric layer 301, the first semiconductor layer 103, the second semiconductor layer 107, the third semiconductor layer 111, and the contacts 303 and may be used to interconnect, e.g., the first semiconductor layer 103, the second semiconductor layer 107, the third semiconductor layer 111 to other circuitry (described further below with respect to FIG. 4). In an embodiment the metallization layer 305 is formed of alternating layers of dielectric and conductive material and may be formed through any suitable process (such as deposition, damascene, dual damascene, etc.). In an embodiment there may be four layers of metallization, but the precise number of layers of dielectric and conductive material is dependent upon the design of the overall device.

By forming the first insulator layer 105 and the second insulator layer 109 between the first semiconductor layer 103, the second semiconductor layer 107, and the third semiconductor layer 111, a double layer transistor structure is formed, wherein a first transistor 307 is formed from the third source/drain regions 209, the third channel 211, the first insulator layer 105 (acting as a gate dielectric for the first transistor 307), and the second semiconductor layer 107 (acting as a gate electrode for the first transistor 307). Additionally, a second transistor 309 is formed from the second source/drain regions 205, the second channel 207, the second insulator layer 109 (acting as a gate dielectric for the second transistor 309) and the third semiconductor layer 111 (acting as a gate electrode for the second transistor 309).

Optionally, and as illustrated in FIG. 3, a third transistor 311 may be formed through the formation of the gate dielectric 113 and the gate electrode 115. In this embodiment the third transistor 311 may be formed from the first source/drain regions 201, the first channel 203, the gate dielectric 113, and the gate electrode 115. However, if desired, the formation of the third transistor 311 is optional and does not need to be completed. In this embodiment the gate dielectric 113 and the gate electrode 115 are simply not formed, and the third semiconductor layer 111 is not separated into the first source/drain regions 201 and the first channel 203.

Figure 4:
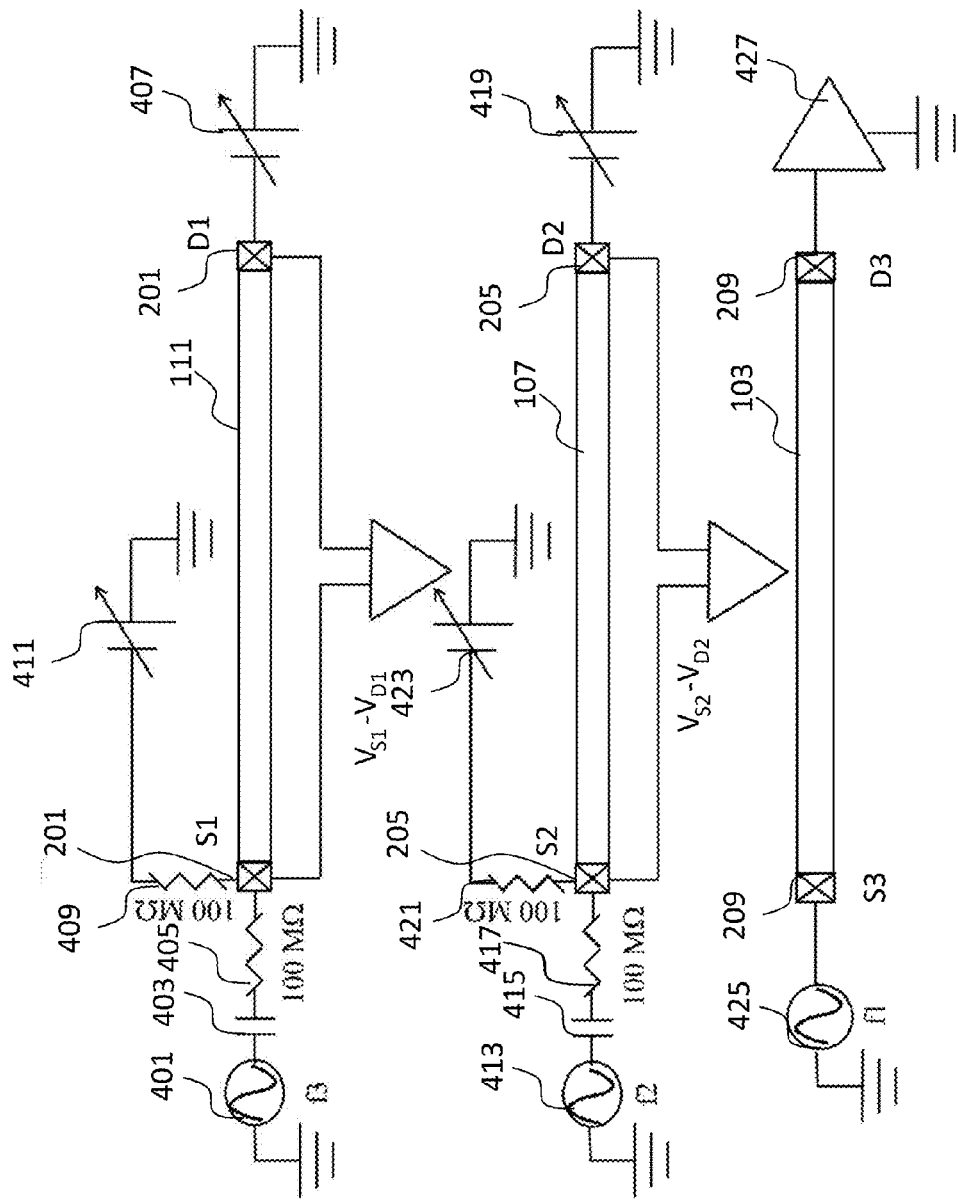
FIG. 4 illustrates an exemplary circuit diagram including the semiconductive and insulative layers in accordance with some embodiments.

FIG. 4 illustrates a circuit diagram of one embodiment of the double layer transistor structure (without the third transistor 311 or wherein the third transistor 311 is turned "on" to allow current to flow through the first channel 203) that illustrates one embodiment of the double layer transistor structure in operation. In this embodiment a first current is passed through the third semiconductor layer 111. In a specific embodiment the first current, such as a current between about 10 nA and about 100 µA, such as about 100 nA, at a first frequency of about 87 Hz, originates with a first AC voltage source 401 and is then, in an embodiment in which the third transistor 311 is formed, applied to a first one of the first source/drain regions 201 (labeled in FIG. 4 as S1), or else directly to the third semiconductor layer 111 in an embodiment in which the third transistor 311 is not formed. The current will then proceed through the third semiconductor layer 111 to the other one of the first source/drain regions 201 (labeled in FIG. 4 as D1) and exit the third semiconductor layer 111.

In some embodiments, and as illustrated in FIG. 4, other elements may be utilized in order to help control and/or protect the first current as it is routed to and from the first semiconductor layer. For example, and as illustrated in FIG. 4, a first capacitor 403 and a first resistor 405 may be placed within the electrical path between the first AC voltage source 401 and the first one of the first source/drain regions 201, and a first variable DC voltage source 407 may be placed within the electrical path between the second one of the first source/drain regions 201 and ground. Additionally, to protect the circuit against shock, a second resistor 409 and a second variable DC voltage source 411 may be placed in series and connected to the first one of the first source/drain regions 201.

In a particular embodiment the first capacitor may have a capacitance of about 47 µF, and the first resistor 405 and the second resistor 409 may each have a resistance of about 100 MΩ. The first variable DC voltage source 407 may have a variable DC voltage source of less than about 1 V, while the second variable DC voltage source may have a voltage of less than about 1 V. However, any suitable and desired devices may alternatively be utilized, and all such elements are fully intended to be included within the scope of the embodiments.

Additionally, the first current is used to bias the third semiconductor layer 111 so that it can be used to control the operation of the second transistor 309 (using the second insulator layer 109 as a gate dielectric and the second channel 207). In particular, when the voltage difference (based on a quasi-four-terminal resistance) between the first one of the first source/drain regions 201 in the third semiconductor layer 111 (S1) and the second one of the first source/drain regions 201 in the third semiconductor layer 111 (D1), $V_{s1}-V_{d1}$, is similar to the gate voltage of the second transistor 309 (based at least in part on the thickness of the second insulator layer 109, which may be tuned to obtain a desired gate voltage), the second transistor 309 will shift its state and turn on or off depending upon the type of device formed from the second semiconductor layer 107. For example, when the gate voltage of the second transistor 309 is similar to the voltage difference through the third semiconductor layer 111, the third semiconductor layer 111 is used as the gate electrode for the second transistor 309.

While the precise voltage difference needed to control the second transistor 309 is dependent upon the properties of the second transistor 309, in some embodiments the first voltage difference may be less than about 1 volt, such as less than about 0.7 volts. However, any suitable voltage difference across the third semiconductor layer 111 may alternatively be utilized, and all such voltage differences that can be used to control the operation of the second transistor 309 are fully intended to be included within the scope of the embodiments.

With the second transistor in an "on" mode that allows for a second current to flow through the second semiconductor layer 107, the second semiconductor layer 107 can be biased with a second current to operate the first transistor 307. For example, the second current, such as a current between about 10 nA and about 500 nA, originates with a second AC voltage source 413 and is then applied to a first one of the second source/drain regions 205 (labeled in FIG. 4 with the label "S2"). Additionally, the second current has a different frequency than the first current in order to avoid any coupling between the circuits. As such, in an embodiment in which the first current (through the third semiconductor layer 111) has the first frequency 17 Hz, the second current will have a second frequency such as 77 Hz. The second current will then proceed through the second semiconductor layer 107 to the other one of the second source/drain regions 205 (labeled in FIG. 4 as D2) and exit the second semiconductor layer 107.

Additionally, as with the first current passing through the third semiconductor layer 111, other elements may be utilized in order to help control and/or protect the second current as it is routed to and from the second semiconductor layer 107. For example, and as illustrated in FIG. 4, a second capacitor 415 and a third resistor 417 may be placed within the electrical path between the second AC voltage source 413 and the first one of the second source/drain regions 205, and a third variable DC voltage source 419 may be placed within the electrical path between the second one of the second source/drain regions 205 and ground. Additionally, to protect the circuit against shock, a fourth resistor 421 and a fourth variable DC voltage source 423 may be placed in series and connected to the first one of the second source/drain regions 205.

In a particular embodiment the second capacitor 415 may have a capacitance of about 34 µF, and the third resistor 417 and the fourth resistor 421 may each have a resistance of about 100 MΩ. The third variable DC voltage source 419 may have a variable DC voltage source of less than about 1 V, while the fourth variable DC voltage source 423 may have a voltage of less than about 1 V. However, any suitable and desired devices may alternatively be utilized, and all such elements are fully intended to be included within the scope of the embodiments.

Additionally, the second semiconductor layer 107 can be biased to control the operation of the first transistor 307 (using the first insulator layer 105 as a gate dielectric and the third channel 211). In particular, when the voltage difference (measured, e.g., using a quasi-four-terminal resistance measurement) between the first one of the second source/drain regions 205 in the second semiconductor layer 107 (S2) and the second one of the second source/drain regions 205 in the second semiconductor layer 107 (D2), $V_{s2}-V_{d2}$, is similar to the gate voltage (which may be tuned by the thickness of the first insulator layer 105) of the first transistor 307, the first transistor 307 will shift its state and turn on or off depending upon the type of device formed from the first semiconductor layer 103. For example, when the gate voltage of the first transistor 307 is similar to the voltage difference through the second semiconductor layer 107, the second semiconductor layer 107 is used as the gate electrode for the first transistor 307.

Additionally, while the precise voltage difference needed to control the first transistor 307 is dependent upon the properties of the first transistor 307, in some embodiments the first voltage difference may be less than about 1 volt, such as less than about 0.7 volts. However, any suitable voltage difference across the second semiconductor layer 107 may alternatively be utilized, and all such voltage differences that can be used to control the operation of the first transistor 307 are fully intended to be included within the scope of the embodiments.

With the operation of the first transistor 307 under the control of the current being passed through the second semiconductor layer 107, when the first transistor 307 is in the "on" state, a third current may be passed through the first semiconductor layer 103. The third current may be generated by a third AC voltage source 425, and may be, e.g., a current of between about 10 nA and about 100 µA, such as about 100 nA, (using two-terminal conductance measurements) although any suitable current may be applied. Additionally, the third current has a different frequency than the first current or the second current in order to avoid any coupling between the circuits. As such, in an embodiment in which the first current (through the third semiconductor layer 111) has the first frequency 17 Hz and the second current (through the second semiconductor layer 107) has a second frequency such as 77 Hz, the third current will have a third frequency such as 87 Hz.

The third current may be routed (e.g., through the metallization layers 305) and applied to a first one of the third source/drain regions 209. With the first transistor 307 in an "on" state, the third current will pass through the first semiconductor layer 103 and exit the first semiconductor layer 103 through a second one of the third source/drain regions 209. In an embodiment the third current may be routed to another device, such as a buffer amplifier 427, although any suitable device may alternatively be utilized.

Optionally, although not illustrated in FIG. 4, other devices may be added to the circuit in electrical connection with the first transistor 307 in order to help control and protect the circuit. For example, additional resistors, capacitors, inductors, combinations of these, or the like may be utilized in order to assist in the control and routing of the desired currents through the device. All such devices are fully intended to be included within the scope of the embodiments.

Additionally, while a two transistor structure and a three transistor structure are described above (depending upon the presence of the third transistor 311), the above description is intended to be illustrative and is not intended to limit the embodiments. Rather, the processes and structures described herein may be extended to include any number of transistor structures, such as a four transistor structure (with, e.g., a layered structure of GaAs/Gd$_2$O$_3$/GaAs/Gd$_2$O$_3$/GaAs/Gd$_2$O$_3$/GaAs), a five transistor structure (with, e.g., a layered structure of GaAs/Gd$_2$O$_3$/GaAs/Gd$_2$O$_3$/GaAs/Gd$_2$O$_3$/GaAs/Gd$_2$O$_3$/GaAs), or even more. Any number of structures is fully intended to be included within the scope of the embodiments.

By forming the first semiconductor layer 103, the second semiconductor layer 107, and the third semiconductor layer 111 in such a stacked configuration, a multi-layer structure 200 comprising multiple transistors may be achieved. As such, a number of devices per unit area can be greatly increased by stacking multiple devices into the same footprint, and the density can double or even triple with a same gate length. Additionally, by providing a three-dimensional integration, more flexibility may be achieved in the design of layouts for circuitry, and may be used for the design of three-dimensional circuits.

Figure 5:
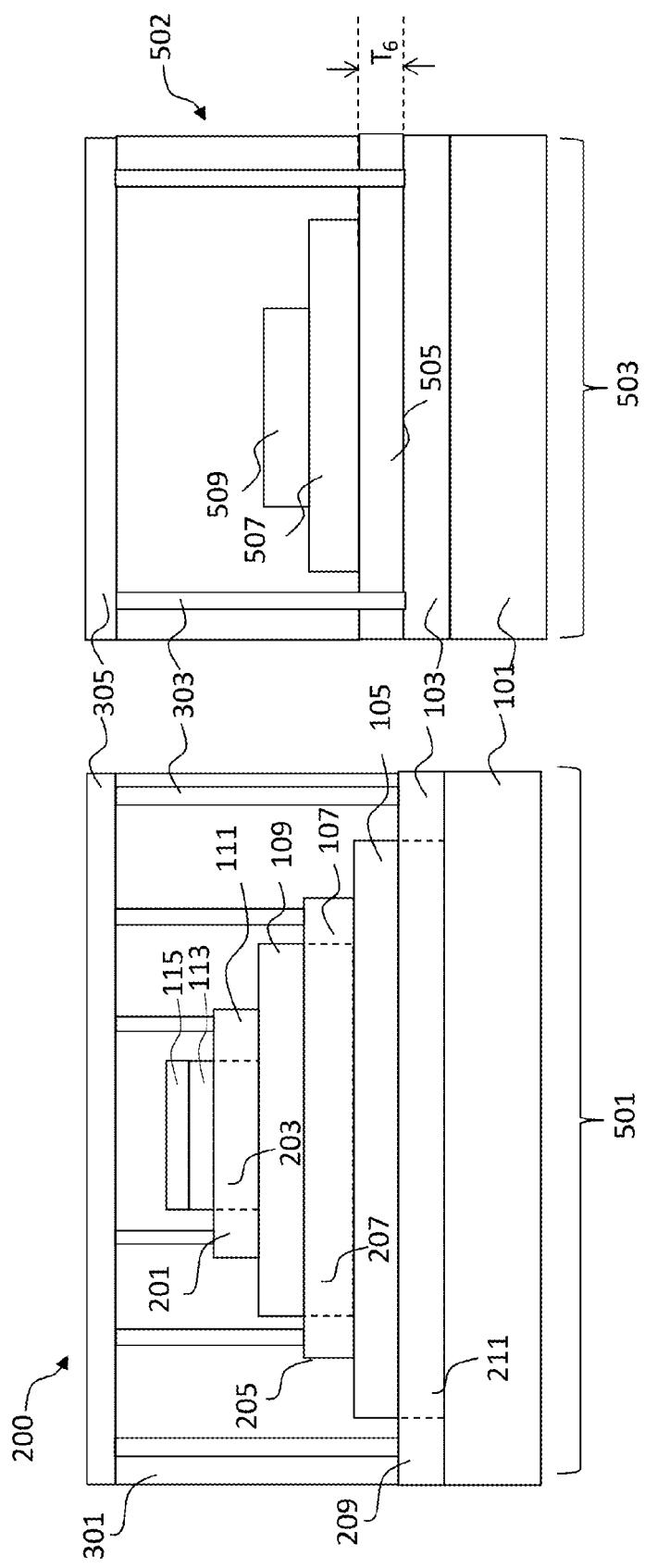
FIG. 5 illustrates a hybrid device comprising the plurality of semiconductive and insulative layers along with a metal-oxide semiconductor high electron mobility transistor in accordance with some embodiments.

FIG. 5 illustrates one application of the multi-layered structure described above with respect to FIGS. 1-4. In this embodiment the multi-layered structure 200 is formed over a first section 501 of the substrate 101, and a metal-oxide semiconductor high electron mobility transistor (MOSHEMT) 502 is formed in a second section 503 of the substrate 101. As an initial starting point the substrate 101, the first semiconductor layer 103, the first insulator layer 105, the second semiconductor layer 107, the second insulator layer 109, and the third semiconductor layer 111 may be formed as described above with respect to FIG. 1. Additionally, the individual layers of the multi-layer structure 200 may then be patterned as described above with respect to FIG. 2. However, during the patterning process, the third semiconductor layer 111, the second insulator layer 109, the second semiconductor layer 107, and the first insulator layer 105 will be completed removed from the second section 503 of the substrate 101 while the first semiconductor layer 103 is formed into the desired shape within the second section 503 of the substrate 101 for the MOSHEMT 502.

Once the first semiconductor layer 103 has been patterned, a fourth semiconductor layer 505 may be selectively formed and, if desired, patterned over the first semiconductor layer 103 within the second section 503 of the substrate 101. In an embodiment the fourth semiconductor layer 505 may be a material with a high carrier mobility such as gallium nitride, although any other suitable semiconductor material, such as gallium arsenide, indium gallium nitride, or indium gallium arsenide may alternatively be utilized. The fourth semiconductor layer 505 may be formed using a using a deposition or growth process such as molecular beam epitaxy (MBE) or metal-organic chemical vapor deposition (MOCVD) using, e.g., (CH$_3$)$_3$Ga and NH$_3$ as precursor materials during the deposition process. In an embodiment the fourth semiconductor layer 505 may be grown to a sixth thickness T$_6$ of between about 5 nm and about 50 nm, such as about 10 nm. However, any other suitable method of formation, and any other suitable thickness may alternatively be utilized.

Once the fourth semiconductor layer 505 has been formed, a third insulator layer 507 and a second gate electrode 509 may be formed over the fourth semiconductor layer 505 to operate as the gate dielectric and gate electrode for the MOSHEMT 502. In an embodiment the third insulator layer 507 and the second gate electrode 509 may be formed using similar processes and materials as described above for the gate dielectric 113 and the gate electrode 115. However, any suitable materials or methods of formation may alternatively be utilized for the third insulator layer 507 and the second gate electrode 509.

Alternatively, the third insulator layer 507 may be grown using the fourth semiconductor layer 505 within the second region 503 as a nucleation layer. In this embodiment the third insulator layer 507 may be grown using materials and processes as described above with respect to the first insulator layer 105, such as by using a molecular beam epitaxy to form a layer of gadolinium oxide. However, any alternative material or method of manufacture may be utilized to form the third insulator layer 507.

Once the second gate electrode 509 and the third insulator layer 507 have been formed, the second gate electrode 509, the third insulator layer 507, and, if desired, the fourth semiconductor layer 505 are patterned to form the MOSHEMT 502. In an embodiment each layer may be individually patterned after the formation of each layer using, e.g., a photolithographic masking and etching process as described above with respect to FIG. 2. Alternatively, the fourth semiconductor layer 505 may be formed after the patterning of the first semiconductor layer 103. Any suitable combination of formation and patterning processes may be performed in order to integrate the manufacturing processes of the multi-layered structure and the MOSHEMT 502.

Once the MOSHEMT 502 has been formed along with the multi-layer structure 200, the interlayer dielectric layer 301, the contacts 303, and the metallization layer 305 are formed over both the multi-layer structure 200 and the MOSHEMT 502. The interlayer dielectric layer 301, the contacts 303 and the metallization layer 305 are formed as described above with respect to FIG. 3, with additional ones of the contacts 303 extending through the fourth semiconductor layer 505 to the first semiconductor layer 103.

By manufacturing the multi-layered structure 200 and the MOSHEMT 502 on the substrate 101, multiple types of circuits may be combined onto a single substrate. For example, by selectively growing the multi-layered structure 200 and the MOSHEMT 502 in different areas of the substrate 101 (e.g. the first section 501 and the second section 503), analogue circuits can be combined with digital circuits on the same wafer. As such, greater flexibility may be achieved in the design and manufacture of integrated circuits.

Figure 6:
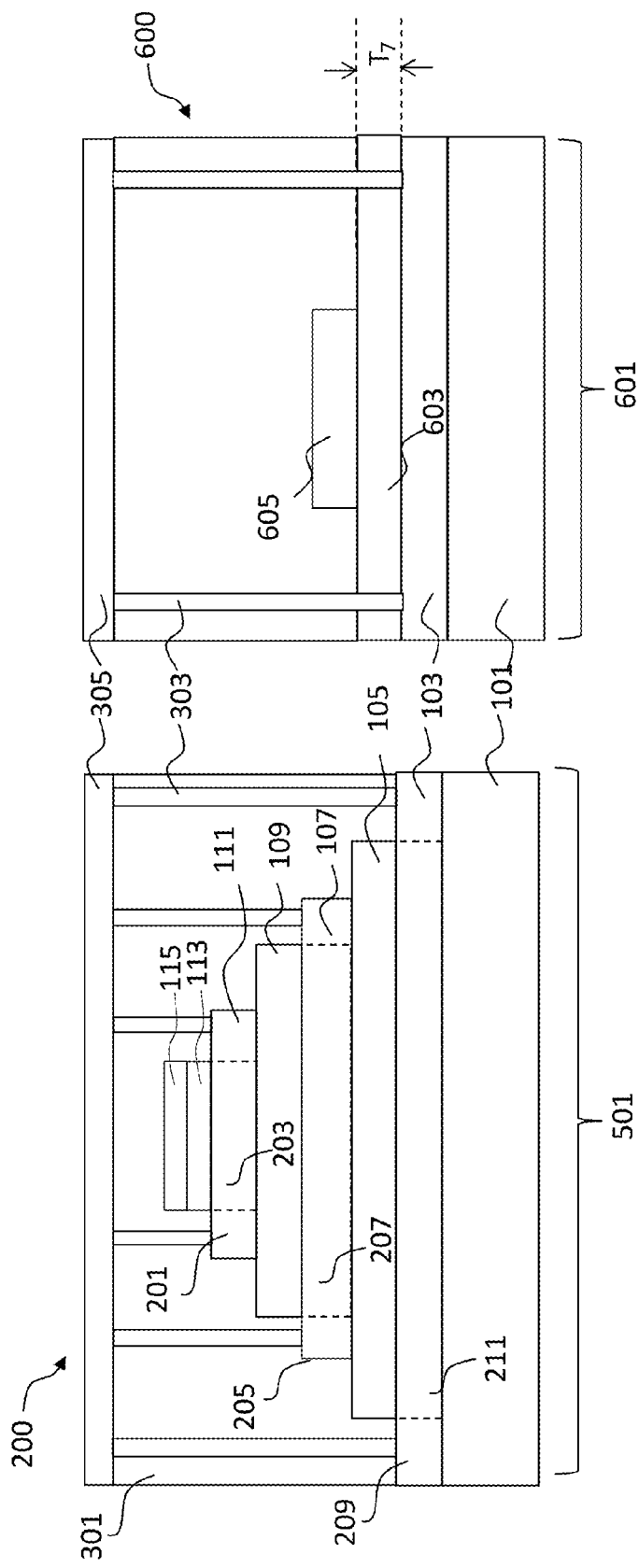
FIG. 6 illustrates a hybrid device comprising the plurality of semiconductive and insulative layers along with a high electron mobility transistor in accordance with some embodiments.

FIG. 6 illustrates another embodiment in which the multi-layer structure 200 as described above with respect to FIGS. 1-4 is utilized within the first section 501 of the substrate 101 along with a high electron mobility transistor 600 formed within a third section 601 of the substrate 101. In this embodiment the first semiconductor layer 103 and the remainder of the multi-layered structure 200 may be formed as described above with respect to FIGS. 1-4, such as by each layer being formed and then patterned into their desired shapes using, e.g., photolithographic masking and etching processes. However, in this embodiment, during the patterning of the first semiconductor layer 103, the first semiconductor layer 103 is patterned to be in both the first section 501 and a third section 601 of the substrate 101.

As such, the first semiconductor layer 103 is available to be used as a base to grow a subsequent fifth semiconductor layer 603. In an embodiment the fifth semiconductor layer 603 comprises a semiconductor material with high carrier mobility such as gallium nitride, although any suitable material, such as indium gallium nitride, gallium arsenide, or indium gallium arsenide, may alternatively be utilized. In an embodiment the fifth semiconductor layer 603 may be formed using a using a deposition or growth process such as molecular beam epitaxy (MBE) or metal-organic chemical vapor deposition (MOCVD). In an embodiment the fifth semiconductor layer 603 may be grown using precursors such as $NH_3$ and $(CH_3)_3Ga$ to a seventh thickness $T_7$ of between about 5 nm and about 50 nm, such as about 10 nm. However, any other suitable method of formation, and any other suitable thickness may alternatively be utilized.

Once the fifth semiconductor layer 603 has been formed, a third gate electrode 605 may be formed over the fifth semiconductor layer 603. In an embodiment the third gate electrode 605 may be formed using similar processes and materials as described above for the gate electrode 115. However, any suitable materials or methods of formation may alternatively be utilized for the third gate electrode 605.

Once the high electron mobility transistor 600 has been formed along with the multi-layer structure 200, the interlayer dielectric layer 301, the contacts 303, and the metallization layer 305 are formed over both the multi-layer structure 200 and the high electron mobility transistor 600. The interlayer dielectric layer 301, the contacts 303 and the metallization layer 305 are formed as described above with respect to FIG. 3, with additional ones of the contacts 303 extending through the fifth semiconductor layer 603 to the first semiconductor layer 103.

By utilizing the process and materials of the multi-layered structure along with the high electron mobility transistor 600, the multi-layered structure may be integrated onto the same substrate (e.g., the substrate 101) as other devices. For example, the analogue circuits and high electron mobility transistors may be combined onto the same wafer. As such, the processes may be used to obtain devices with a larger diversity in a more efficient manner.

Figure 7:
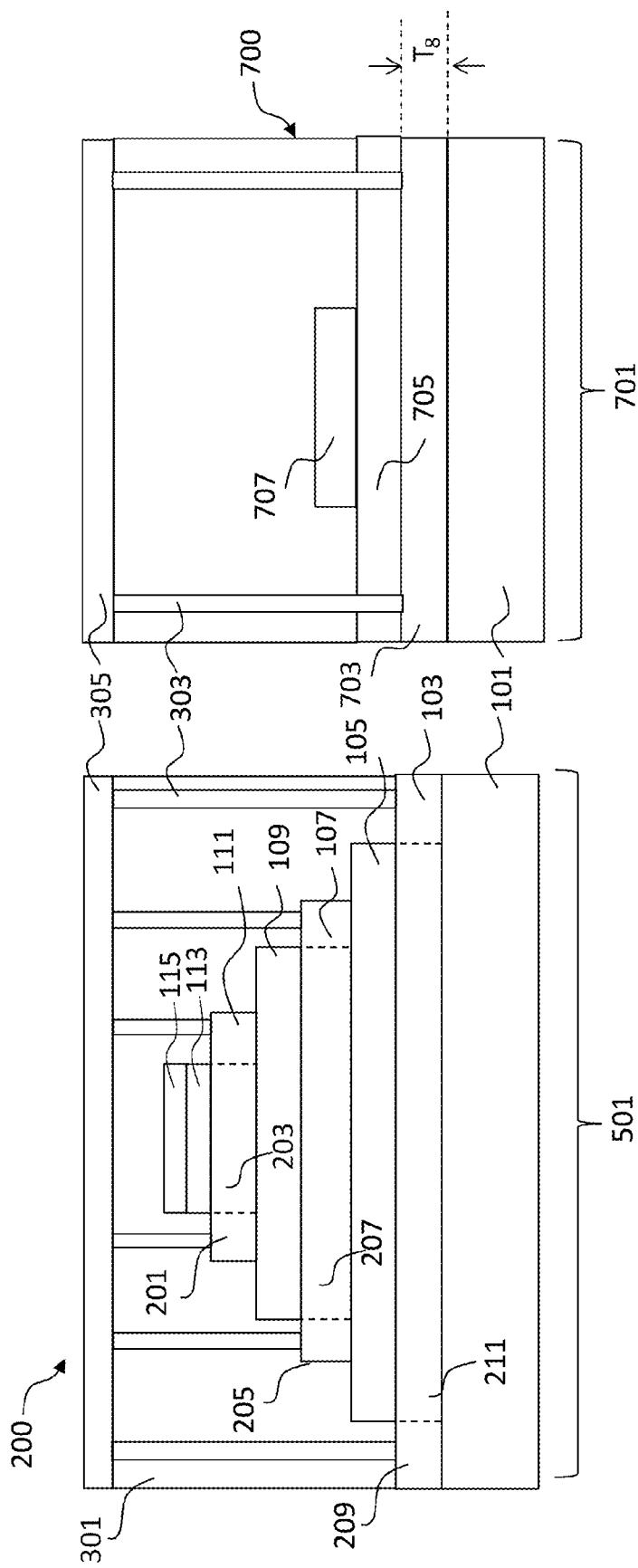
FIG. 7 illustrates a hybrid device comprising the plurality of semiconductive and insulative layers along with a normally-off device in accordance with some embodiments.

FIG. 7 illustrates yet another embodiment in which the multi-layered structure is integrated with other devices, such as a normally-off device 700. In this embodiment the multi-layered structure 200 is formed in the first section 501 of the substrate 101, and the normally-off device 700 is formed in a fourth section 701 of the substrate 101. In this embodiment the multi-layered structure 200 is formed as described above with respect to FIGS. 1-4, with all of the materials of the multi-layer structure 200 (e.g., the first semiconductor layer 103, the first insulator layer 105, the second semiconductor layer 107, the second insulator layer 109, and the third semiconductor layer 111) being patterned and removed from the fourth section 701 of the substrate 101.

Once the elements of the multi-layered structure 200 have been removed from the fourth section 701 of the substrate 101, a sixth semiconductor layer 703 may be formed in the fourth section 701 of the substrate 101. In an embodiment the sixth semiconductor layer 703 comprises a semiconductor material such as gallium nitride or gallium arsenide, although any other suitable material may alternatively be utilized.

In an embodiment the sixth semiconductor layer 703 may be formed using a using a deposition or growth process such as molecular beam epitaxy (MBE) or metal-organic chemical vapor deposition (MOCVD) to grow the sixth semiconductor layer 703 on the substrate 101. In an embodiment the sixth semiconductor layer 703 may be grown with precursors such as $(CH_3)_3Ga$ and $NH_3$ to an eighth thickness $T_8$ of between about 5 nm and about 40 nm, such as about 10 nm. However, any other suitable method of formation, and any other suitable thickness may alternatively be utilized.

Once the sixth semiconductor layer 703 has been formed, a third insulator layer 705 may be formed on the on the sixth semiconductor layer 703. In an embodiment the third insulator layer 705 may be formed of similar materials and from similar processes as the first insulator layer 105 (described above with respect to FIG. 1) and grown using the sixth semiconductor layer 703 as a nucleation layer. However, any other suitable dielectric material (such as the dielectric materials described above with respect to the gate dielectric 113 in FIG. 1) may alternatively be used. All such materials and processes are fully intended to be included within the scope of the embodiments.

After the third insulator layer 705 has been formed, a fourth gate electrode 707 may be formed over the third insulator layer 705. In an embodiment the fourth gate electrode 707 may be formed using similar processes and materials as described above for the gate electrode 115. However, any suitable materials or methods of formation may alternatively be utilized for the fourth gate electrode 707.

Once the normally-off device 700 has been formed along with the multi-layer structure 200, the interlayer dielectric layer 301, the contacts 303, and the metallization layer 305 are formed to both the multi-layer structure 200 and the normally-off device 700. The interlayer dielectric layer 301, the contacts 303 and the metallization layer 305 are formed as described above with respect to FIG. 3, with additional ones of the contacts 303 extending through the third insulator layer 705 to the sixth semiconductor layer 703.

By utilizing the process and materials of the multi-layered structure 200 along with the normally-off device 700, the multi-layered structure 200 may be integrated onto the same substrate (e.g., the substrate 101) as other devices. For example, the analogue circuits and normally off structures may be combined onto the same wafer. As such, the processes may be used to obtain more varied devices in a more efficient manner.

Figure 8:
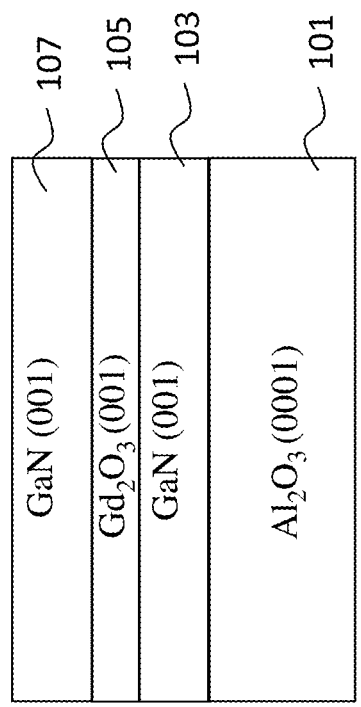
FIG. 8 illustrates an embodiment of a gallium nitride/gadolinium oxide/gallium nitride structure in accordance with some embodiments.
Figure 9:
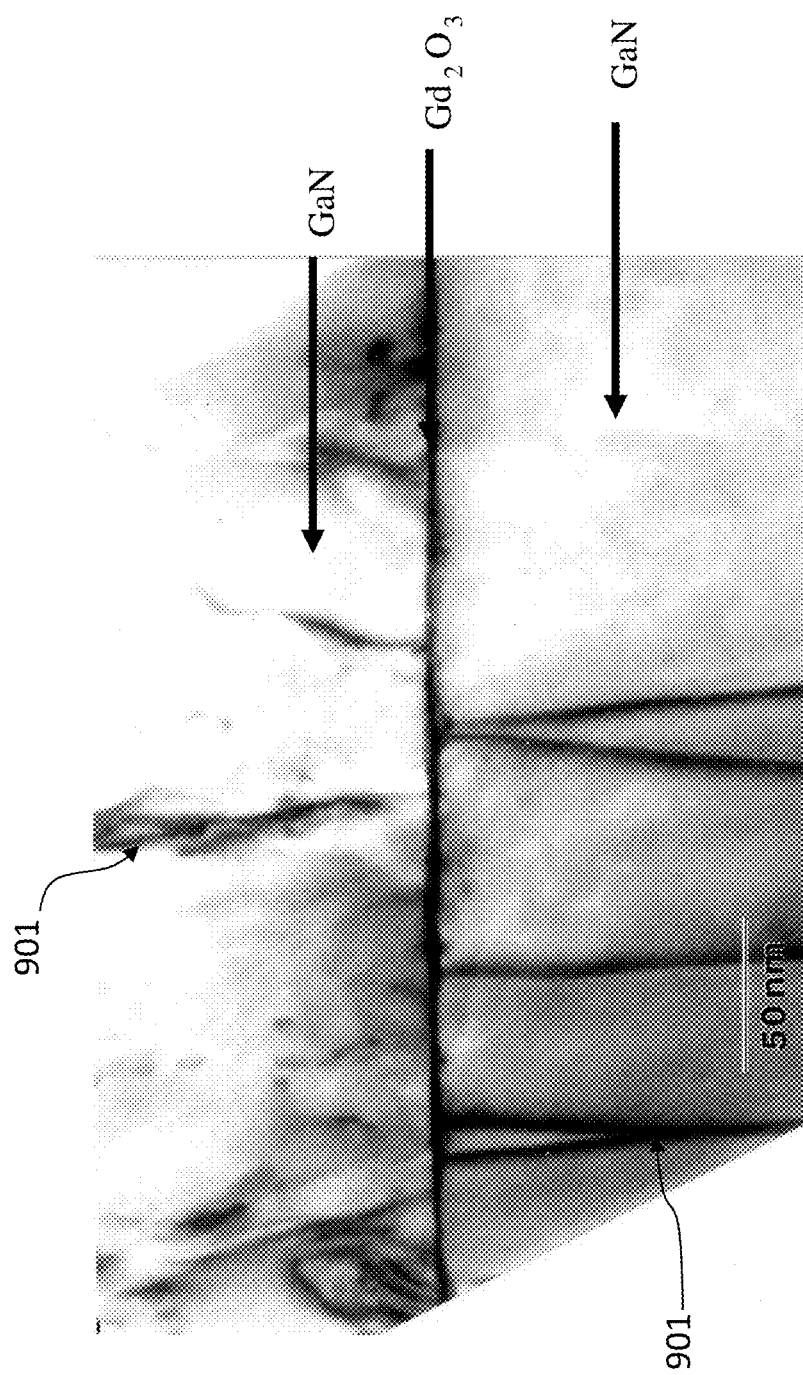
FIGS. 9-10 illustrate TEM images of embodiments in accordance with some embodiments.
Figure 10:
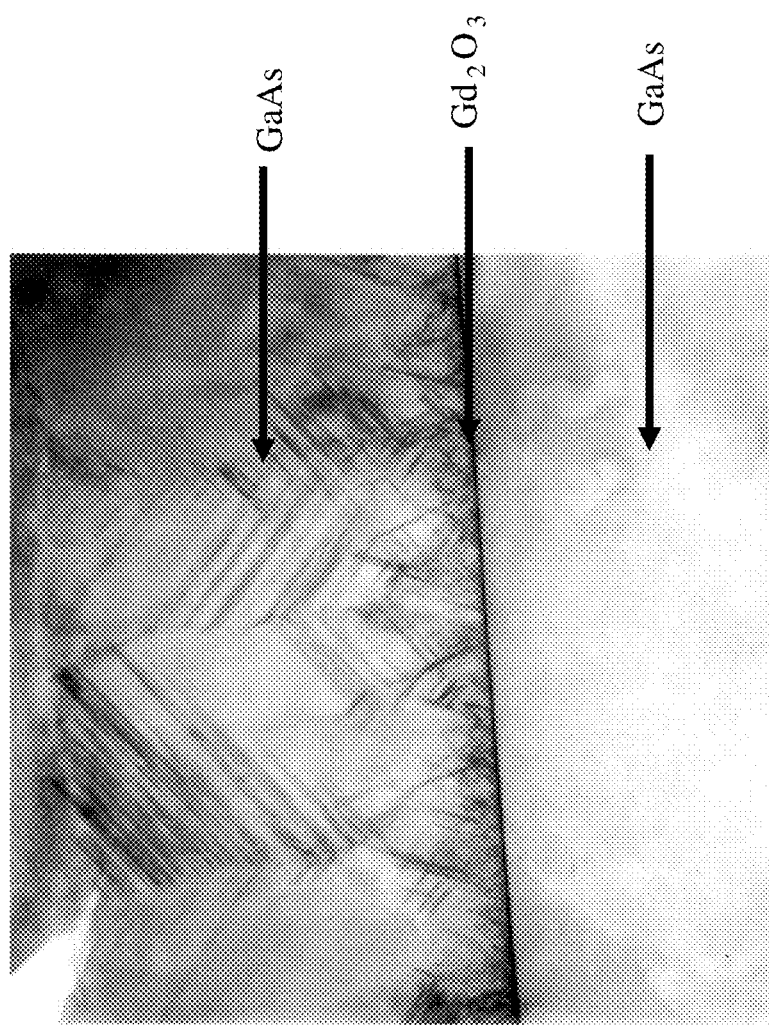

FIGS. 8-10 illustrate different specific embodiments that may be utilized with the embodiments described herein. Looking first at FIG. 8, an embodiment is illustrated wherein the substrate 101 is made from aluminum oxide ($Al_2O_3$), the first semiconductor layer 103 is formed from gallium nitride (GaN), the first insulator layer 105 is formed from gadolinium oxide ($Gd_2O_3$), and the second semiconductor layer 107 is formed from gallium nitride (GaN). In this embodiment the aluminum oxide has a bulk (0001) crystalline orientation, an in-plane lattice constant of 4.758 Å, and an out-of plane lattice constant of 12.99 Å. Additionally, the aluminum oxide may have a surface orientation that has a 30 degree rotation, wherein the surface of the aluminum oxide has an in-plane lattice constant of 4.12 Å.

The first semiconductor layer 103 of gallium nitride grown on the aluminum oxide has a crystalline orientation of (001), an in-plane lattice constant of 3.189 Å, and an out-of plane lattice constant of 5.185 Å. The first insulator layer 105 of gadolinium oxide ($Gd_2O_3$) (with no in-plane rotation) grown on the gallium nitride (GaN) has a crystalline orientation of (001), an in-plane lattice constant of 3.86 Å and an out-of plane lattice constant of 6.16 Å. Finally, the second semiconductor layer 107 of gallium nitride with no in-plane rotation and grown on the first insulator layer 105 of gadolinium oxide ($Gd_2O_3$) has a crystalline orientation of (001), an in-plane lattice constant of 3.189 Å and an out-of plane lattice constant of 5.185 Å.

FIG. 9 illustrates a TEM image of another embodiment of gallium nitride grown on gadolinium oxide ($Gd_2O_3$), which itself is grown on gallium nitride grown on aluminum oxide (the aluminum oxide is not illustrated in this picture but is present beneath the bottom gallium nitride layer). In this sample, the gallium nitride is grown on the aluminum oxide to a thickness of about 0.64 μm, and the gadolinium oxide ($Gd_2O_3$) is grown on gallium nitride to a thickness of 24 Å. Different dislocations, pointed out in FIG. 9 by the arrows labeled 901, are different in the gallium nitride on one side of the gadolinium oxide ($Gd_2O_3$) than on the other side of the gadolinium oxide ($Gd_2O_3$).

FIG. 10 illustrates a separate TEM image illustrating another growth of gadolinium oxide ($Gd_2O_3$) over a layer of epitaxially grown gallium arsenide. In this embodiment the gadolinium oxide ($Gd_2O_3$) is grown to a thickness of 25 Å as measured by TEM (or 18 Å as measured by ellipsometry). The gallium arsenide is grown over the gadolinium oxide ($Gd_2O_3$) to a thickness of 0.54 μm.

In accordance with an embodiment, a semiconductor device comprising a first semiconductor layer over a substrate and a first insulator layer over the first semiconductor layer is provided. A second semiconductor layer is over the first insulator layer, wherein the first semiconductor layer, the first insulator layer, and the second semiconductor layer form a first transistor. A second insulator layer is over the second semiconductor layer, and a third semiconductor layer is over the second insulator layer, wherein the second semiconductor layer, the second insulator layer, and the third semiconductor layer form a second transistor over the first transistor.

In accordance with another embodiment, a semiconductor device comprising a first transistor formed over a substrate, the first transistor comprising a first semiconductor layer, a first insulator layer, wherein the first insulator layer comprises a first single-crystal material, and a second semiconductor layer, wherein the second semiconductor layer comprises a first epitaxial material is provided. A second transistor is formed over the substrate, wherein the second transistor is located further from the substrate than the first transistor, wherein the second transistor further comprises the second semiconductor layer, a second insulator layer over the second semiconductor layer, wherein the second insulator layer comprises a second single-crystal material, and a third semiconductor layer over the second insulator layer, wherein the third semiconductor layer comprises a second epitaxial material.

In accordance with yet another embodiment, a method of manufacturing a semiconductor device, the method comprising forming a first semiconductor layer over a substrate and growing a single-crystal first insulator layer from the first semiconductor layer is provided. A second semiconductor layer is grown from the single-crystal first insulator layer and a single-crystal second insulator layer is grown from the second semiconductor layer. A third semiconductor layer is grown from the single-crystal second insulator layer, and the first semiconductor layer, the single-crystal first insulator layer, the second semiconductor layer, the single-crystal second insulator layer, and the third semiconductor layer are patterned into a first transistor and a second transistor, wherein the second semiconductor layer is a gate electrode within the first transistor and a channel region in the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first semiconductor layer over a substrate;
    epitaxially growing a single-crystal first insulator layer over the first semiconductor layer;
    epitaxially growing a second semiconductor layer over the single-crystal first insulator layer;
    epitaxially growing a single-crystal second insulator layer over the second semiconductor layer;
    epitaxially growing a third semiconductor layer over the single-crystal second insulator layer;
    patterning the first semiconductor layer, the single-crystal first insulator layer, the second semiconductor layer, the single-crystal second insulator layer, and the third semiconductor layer into a stair-step pattern; and
    forming contacts to the first semiconductor layer, the second semiconductor layer, and the third semiconductor layer.

2. The method of claim 1, wherein the epitaxially growing the single-crystal first insulator layer comprises growing the single-crystal first insulator layer from the first semiconductor layer.

3. The method of claim 1, wherein the epitaxially growing the second semiconductor layer comprises at least in part a molecular beam epitaxy process.

4. The method of claim 3, wherein the epitaxially growing the second semiconductor layer comprises introducing dopants into the second semiconductor layer during the molecular beam epitaxy process.

5. The method of claim 1, further comprising implanting dopants into the second semiconductor layer after the epitaxially growing the second semiconductor layer.

6. The method of claim 1, further comprising depositing a gate dielectric and gate electrode over the third semiconductor layer.

7. A method of manufacturing a semiconductor device, the method comprising:
    growing a transistor stack, the growing the transistor stack comprising:
        growing a first insulator layer from a first semiconductor layer;
        growing a second semiconductor layer from the first insulator layer; and
        growing a second insulator layer from the second semiconductor layer; and
    patterning the transistor stack, the patterning the transistor stack comprising:
        using a first mask to pattern the second insulator layer;
        using a second mask different from the first mask to pattern the second semiconductor layer; and
        using a third mask different from the second mask to pattern the first insulator layer.

8. The method of claim 7, further comprising growing a third semiconductor layer from the second insulator layer.

9. The method of claim 8, further comprising patterning the third semiconductor layer with a fourth mask different from the first mask.

10. The method of claim 9, further comprising forming a gate dielectric and gate electrode over the third semiconductor layer.

11. The method of claim 10, implanting dopants into the third semiconductor layer after the forming the gate dielectric and the gate electrode.

12. The method of claim 7, further comprising:
    depositing an interlayer dielectric over the second semiconductor layer; and
    forming contacts through the interlayer dielectric to the first semiconductor layer.

13. The method of claim 12, wherein the forming the contacts forms shallow ohmic contacts.

14. The method of claim 7, wherein the growing the first insulator layer is performed at least in part through a molecular beam epitaxy process.

15. A method of manufacturing a semiconductor device, the method comprising;
    forming a first transistor and a second transistor over a first region of a substrate, the forming the first transistor and the second transistor comprising:
        growing a first insulator layer over a first semiconductor layer;
        growing a second semiconductor layer over first insulator layer;
        growing a second insulator layer over the second semiconductor layer; and
        patterning the first semiconductor layer, the first insulator layer, the second semiconductor layer, and the second insulator layer into the first transistor overlying the second transistor; and
    forming a third transistor in a second region of the substrate separate from the first region, wherein at least part of the forming the third transistor is performed after the forming the first transistor and the second transistor.

16. The method of claim 15, wherein the forming the third transistor comprises forming a metal-oxide semiconductor high electron mobility transistor.

17. The method of claim 15, wherein the forming the third transistor comprises forming a normally-off device.

18. The method of claim 15, wherein the forming the third transistor comprises epitaxially growing a third semiconductor layer on the first semiconductor layer.

19. The method of claim 18, further comprising forming a gate dielectric in physical contact with the third semiconductor layer.

20. The method of claim 18, further comprising forming a gate electrode in physical contact with the third semiconductor layer.

* * * * *